United States Patent
Coss, Jr. et al.

(10) Patent No.: US 8,359,494 B2
(45) Date of Patent: Jan. 22, 2013

(54) PARALLEL FAULT DETECTION

(75) Inventors: Elfido Coss, Jr., Austin, TX (US);
Ernest D. Adams, III, Austin, TX (US);
Robert J. Chong, Austin, TX (US);
Howard E. Castle, Austin, TX (US);
Thomas J. Sonderman, Austin, TX (US); Alexander J. Pasadyn, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 2864 days.

(21) Appl. No.: 10/323,272

(22) Filed: Dec. 18, 2002

(65) Prior Publication Data
US 2004/0123182 A1 Jun. 24, 2004

(51) Int. Cl.
G06F 11/00 (2006.01)
(52) U.S. Cl. .......................................................... 714/25
(58) Field of Classification Search .................. 714/25, 714/47, 52; 438/5, 17, 10; 324/765; 700/121
See application file for complete search history.

(56) References Cited

U.S. PATENT DOCUMENTS

| | | | | |
|---|---|---|---|---|
| 5,483,636 A * | 1/1996 | Saxena | ............................ | 714/25 |
| 5,492,440 A | 2/1996 | Spaan et al. | | |
| 5,495,417 A | 2/1996 | Fuduka et al. | | |
| 5,642,296 A | 6/1997 | Saxena | ......................... | 364/552 |
| 5,859,964 A | 1/1999 | Wang et al. | ............... | 395/185.01 |
| 5,864,773 A | 1/1999 | Barna et al. | ...................... | 702/85 |
| 6,115,643 A * | 9/2000 | Stine et al. | ..................... | 700/110 |
| 6,246,787 B1 * | 6/2001 | Hennessey et al. | ........... | 382/141 |
| 6,336,055 B1 * | 1/2002 | Cho | .............................. | 700/121 |
| 6,415,276 B1 | 7/2002 | Heger et al. | ..................... | 706/52 |
| 6,484,064 B1 * | 11/2002 | Campbell | ..................... | 700/100 |
| 6,535,783 B1 | 3/2003 | Bushman et al. | ............. | 700/121 |
| 6,587,744 B1 * | 7/2003 | Stoddard et al. | .............. | 700/121 |
| 6,645,780 B1 * | 11/2003 | Sonderman et al. | ............ | 438/14 |
| 6,757,621 B2 * | 6/2004 | Mizuno et al. | .................. | 702/35 |
| 6,850,811 B1 * | 2/2005 | Stewart | ......................... | 700/110 |
| 6,954,883 B1 * | 10/2005 | Coss et al. | ....................... | 714/47 |
| 7,113,838 B2 * | 9/2006 | Funk et al. | ..................... | 700/108 |
| 2003/0045009 A1 | 3/2003 | Tanaka et al. | ...................... | 438/8 |

FOREIGN PATENT DOCUMENTS

| | | |
|---|---|---|
| WO | 01/18623 | 5/2000 |
| WO | 01/52320 A1 | 9/2000 |
| WO | 00/79355 A1 | 12/2000 |
| WO | 02/10873 A2 | 7/2001 |

OTHER PUBLICATIONS

Official Communication dated Action, Mar. 18, 2007 (Translated).
International Search Report dated Jun. 23, 2004 for International Application No. PCT/US03/35330 filed Nov. 6, 2006.

* cited by examiner

*Primary Examiner* — Amine Riad
(74) *Attorney, Agent, or Firm* — Williams, Morgan & Amerson, P.C.

(57) ABSTRACT

A method and an apparatus are provided for parallel fault detection. The method comprises receiving data associated with processing of a workpiece by a first processing tool, receiving data associated with processing of a workpiece by a second processing tool and comparing at least a portion of the received data to a common fault model to determine if a fault associated with at least one of the processing of the workpiece by the first processing tool and processing of the workpiece by the second processing tool occurred.

21 Claims, 2 Drawing Sheets

PARALLEL FAULT DETECTION

BACKGROUND OF THE INVENTION

1. Field of the Invention

This invention relates generally to an industrial process, and, more particularly, to performing fault detection in parallel in a semiconductor fabrication process.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a group of wafers, sometimes referred to as a "lot," using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial improvements.

One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface, which facilitates communications between the manufacturing tool and the manufacturing framework. The machine interface can generally be part of an Advanced Process Control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process, various events may take place that affect the performance of the devices being fabricated. That is, variations in the fabrication process steps result in device performance variations. Factors, such as feature critical dimensions, doping levels, particle contamination, film optical properties, film thickness, film uniformity, etc., all may potentially affect the end performance of the device. Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology data to attempt to achieve post-processing results as close to a target value as possible. Reducing variation in this manner leads to increased throughput, reduced cost, higher device performance, etc., all of which equate to increased profitability.

Fault detection can also affect the profitability of industrial processes, including semiconductor manufacturing processes. Typically, a fault model representative of the operation of a processing tool may be utilized to detect faults. A fault model, which may be generated based on historical data, can range from a small, simple model to a large, more complex model, depending on the particular implementation. Each processing tool commonly has its own associated fault model to detect faults associated with that processing tool. As the number of processing tools increases in a manufacturing system, the number of fault models required also increases, which may increase the hardware resources needed to store the fault models. Furthermore, substantial human and hardware resources may be expended to keep the large number of fault models regularly updated.

The present invention is directed to overcoming, or at least reducing the effects of, one or more of the problems set forth above.

SUMMARY OF THE INVENTION

In one embodiment of the present invention, a method is provided for parallel fault detection. The method comprises receiving data associated with processing of a workpiece by a first processing tool, receiving data associated with processing of a workpiece by a second processing tool and comparing at least a portion of the received data to a fault model common to both of the processing tools to determine if a fault associated with at least one of the processing of the workpiece by the first processing tool and processing of the workpiece by the second processing tool occurred.

In another embodiment of the present invention, an apparatus is provided for parallel fault detection. The apparatus comprises an interface communicatively coupled to a control unit. The interface is adapted to receive trace data associated with processing of workpieces by the first and second processing tools. The control unit is adapted to detect a fault associated with at least one of the first and second processing tool based on comparing at least a portion of the received trace data to a fault model representative of an acceptable operational range of at least the first and second processing tools.

In a further embodiment of the present invention, an article comprising one or more machine-readable storage media containing instructions is provided for parallel fault detection. The one or more instructions, when executed, enable the processor to receive data associated with processing of a workpiece by a first processing tool and receive data associated with processing of a workpiece by a second processing tool and compare at least a portion of the received data to a fault model to determine if a fault associated with the processing of the workpiece by the first processing tool occurred, wherein the fault model is representative of the first and the second processing tool.

In a further embodiment of the present invention, a system is provided for parallel fault detection. The system comprises a first processing tool, a second processing tool and a fault detection unit. The first processing tool is adapted to process a wafer. The second processing tool is adapted to process a wafer. The fault detection unit is adapted to receive data associated with the processing of the wafer by the first processing tool and by the second processing tool and detect a fault associated with at least one of the first and second processing tool based on comparing at least a portion of the received data to a fault model, wherein the fault model is representative of an acceptable operational range of at least the first and second processing tools.

BRIEF DESCRIPTION OF THE DRAWINGS

The invention may be understood by reference to the following description taken in conjunction with the accompanying drawings, in which like reference numerals identify like elements, and in which.

Figure 1:
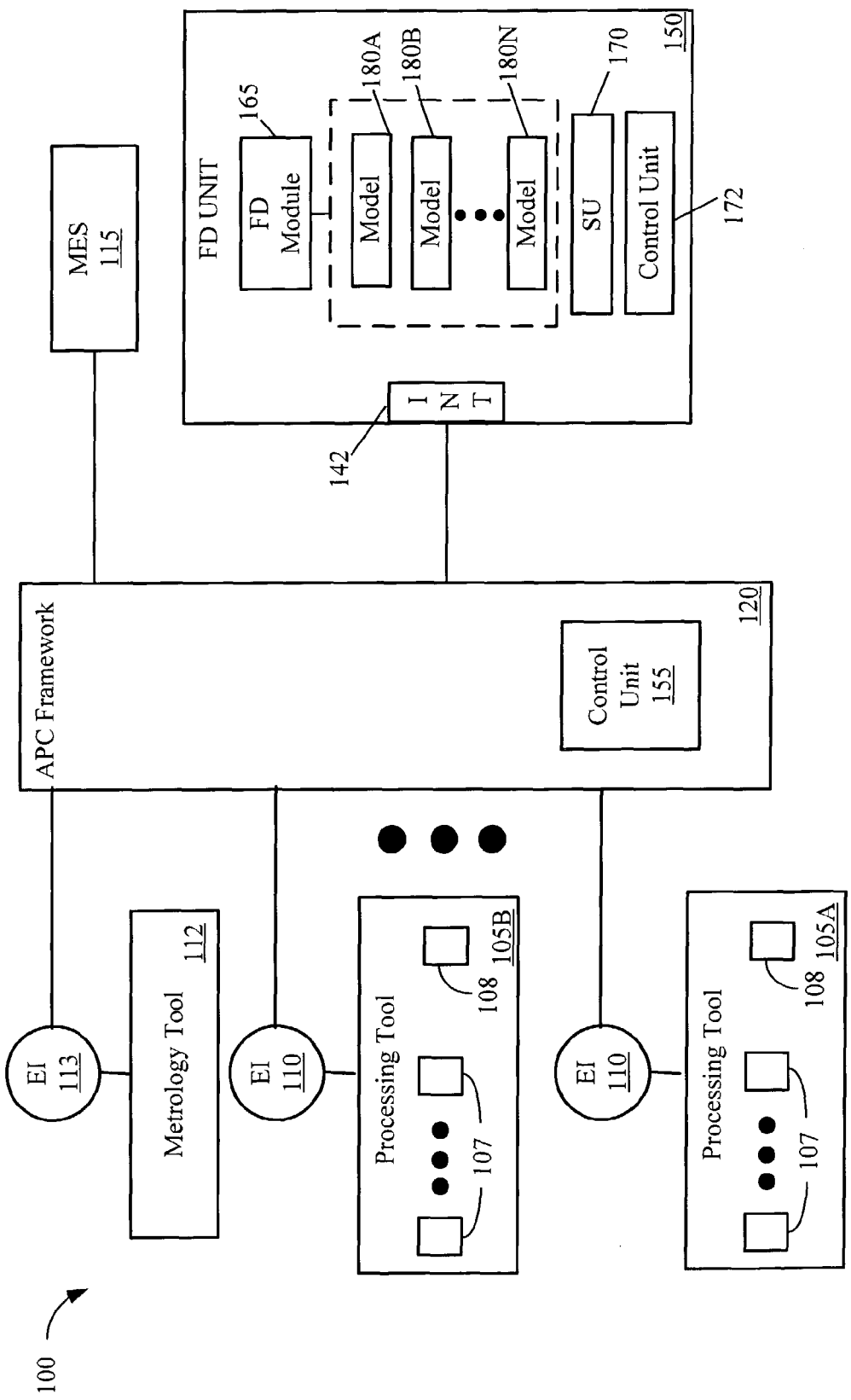
FIG. 1 illustrates a block diagram of a system for implementing an industrial process, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a block diagram of a system 100 is illustrated in accordance with one embodiment of the present invention. The system 100, in the illustrated embodiment, includes a plurality of processing tools 105 (shown as 105A, 105B) for performing an industrial process, such as a semiconductor fabrication process, a photographic process, a chemical process, and the like.

For illustrative purposes, the processing tools 105 are semiconductor fabrication processing tools. As such, the processing tools 105 may take the form of any semiconductor fabrication equipment used to produce a processed workpiece, such as a silicon wafer. An exemplary processing tool 105 may take the form of an exposure tool, etch tool, deposition tool, polishing tool, rapid thermal processing tool, test-equipment tool, implantation tool, and the like. The semiconductor process may be utilized to produce a variety of integrated circuit products including, but not limited to, microprocessors, memory devices, digital signal processors, application specific integrated circuits (ASICs), or other similar devices.

The processing tools 105 may be capable of processing a variety of workpieces, although, for illustrative purposes, it is herein assumed that the processing tools 105 process semiconductor wafers. Accordingly, for the purposes of this discussion, the term "wafer" or "wafers" is employed hereinafter.

In one embodiment, the plurality of processing tools 105 may be like tools (i.e., all etching tools, deposition tools, and the like). Furthermore, in one embodiment, the processing tools 105 may have similar physical configurations, such as the same number of chambers, wafer transport systems, and the like.

As described in more detail below, in accordance with one or more embodiments of the present invention, a robust and efficient fault detection system is disclosed. With the advent of one or more embodiments of the present invention, fault detection may be performed in parallel for a plurality of processing tools 105 based on one or more common fault models.

The processing tools 105 may include one or more sensors 107 for measuring a variety of variables, such as temperature, pressure, mechanical positioning of signatures from an alignment stage, operating characteristics of a light source or radiation source, and the like. The processing tools 105, in one embodiment, may include one or more in-line metrology tools 108 that measure various aspects of the processed wafer or operating characteristics of one or more of the processing tools 105. In the illustrated embodiment, the sensors 107 and/or the in-line (or in-situ) metrology tools 108 provide data (commonly referred to as "trace data") in substantially real time as each wafer or batch of wafers is processed.

In the system 100 of FIG. 1, each processing tool 105 may have an associated equipment interface 110 for interfacing with an Advanced Process Control (APC) framework 120. The manufacturing system 100 may include a manufacturing execution system (MES) 115 that is coupled to the APC framework 120, and an off-line metrology tool 112 that is coupled to the APC framework 120 through an associated equipment interface 113. The metrology tool 112 may provide wafer-related data that characterizes the quality of the wafer that is processed by the processing tools 105. The wafer product data is generated from specific quantitative and/or qualitative measurements that are taken from the wafer by the metrology tool 112. For example, the wafer product data may include film thickness measurements, line width measurements, and/or overlay offset measurements of the wafer. It will be appreciated that these specific measurements that define the wafer product data are merely exemplary. Accordingly, various other measurements may also be taken to determine whether the wafers that are being processed by the processing tools 105 possess the quantitative or qualitative characteristics desired. The specific manner in which the wafer product data is obtained by the metrology tool 112 is well known to those of ordinary skill in the art and the details of such will not be discussed herein to avoid unnecessarily obscuring the present invention.

The manufacturing execution system 115 may, for example, determine the processes that are to be performed by the processing tool 105, when these processes are to be performed, how these processes are to be performed, etc. In the illustrated embodiment, the manufacturing execution system 115 manages and controls the overall system through the APC framework 120. The APC framework 120 includes a process control unit 155 that, through a feedback or feed forward process, aids the processing tool 105 towards performing a desired process to thereby achieve a desired result.

An exemplary APC framework 120 that may be suitable for use in the manufacturing system 100 may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework.

CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

The manufacturing system 100, in the illustrated embodiment, also includes a fault detection (FD) unit 150 that is coupled to the APC framework 120 via an interface 142. The interface 142 may be any acceptable structure(s) that allow(s) the FD unit 150 to communicate with other devices. The FD unit 150 may include a fault detection (FD) module 165 that is storable in a storage unit (SU) 170. The FD unit 150 includes a control unit 172 for managing the overall operations and executing one or more software applications resident in the storage unit 170.

The FD unit 150 may detect a fault associated with the processing tools 105 (or with the process operation performed by a processing tool 105) based on comparing the received trace data from the processing tools 105 to one or more fault models 180 (shown as 180A-N). In one embodiment, the trace data may be provided by the off-line metrology tool 112. The fault models 180 may be generated based on history data from other similar-type tools, where it was previously known that such tools had performed within acceptable operating limits.

In the illustrated embodiment, each fault model 180 may be defined to correspond to a selected processing recipe step (or a tool state) of like-type processing tools 105. For example, based on historical data collected from the plurality of processing tools 105 (or similar type tools), the first fault model 180A may be defined to represent the processing step of, for instance, "tool setup." Thus, in this example, the first fault model 180A is a conglomeration of the historical data collected from the plurality of like-type processing tools 105 such that the fault model 180A represents an acceptable operational range of the "tool setup" step in the plurality of processing tools 105. Accordingly, the fault model 180A may later be utilized to determine if the step of "tool setup" performs as desired for one or more of the processing tools 105. Similarly, other fault models 180B-N may be generated to represent various other process recipe steps (or tool process states) for the purposes of fault detection. In one embodiment, an overall fault model may be generated where the overall fault model may be utilized to gauge the performance of each of the desired processing tools 105. In one embodiment, the fault model may be an algorithm.

In accordance with one embodiment of the present invention, common fault models 180 are utilized to identify fault(s) associated with a plurality of the processing tools 105. The manner is which the faults are detected using the fault models 180 is described below with respect to FIG. 2. Faults associated with the processing tools 105 may occur for a variety of reasons, including an unknown disturbance, hardware failure, depletion of resources (e.g., gases, liquids, chemicals), defects in incoming wafer(s), defects in the processed wafer (s), and the like.

As noted, the fault models 180 may be representative of the process or processes that is/are carried out by the plurality of processing tools 105A, 105B. In an alternative embodiment, the models 180A-N may have a hierarchical relationship, wherein the fault model 180N may be representative of the performance at the lowest (i.e., sensor) level, wherein the fault model 180A may be representative of the performance at the highest (i.e., tool) level, and wherein the other fault models 180 may be representative of the performance at some intermediate levels.

It should be appreciated that the number and scope of fault models employed in a particular manufacturing system 100 may vary from one implementation to another. For example, in one embodiment, a single, overall fault model 180A may be sufficient, while in other embodiments, a plurality of more specific fault models 180A-N may be employed.

As indicated, the FD unit 150 includes the FD module 165, which, in the illustrated embodiment, is implemented in software, and, as such, is stored in the storage unit 170 of the FD unit 150. In other embodiments, the FD module 165 may be implemented in hardware or firmware. For illustrative purposes, the FD module 165 is shown resident in the FD unit 150, although it should be noted that the FD module 165 may be implemented in any suitable component of the manufacturing system 100, including in the APC framework 120. In one embodiment, the FD module 165 may be implemented as a standalone unit, for example, in a data processing unit or computer.

It should be understood that the illustrated components shown in the block diagram of the system 100 in FIG. 1 are illustrative only, and that, in alternative embodiments, additional or fewer components may be utilized without deviating from the spirit or scope of the invention. For example, in one embodiment, the MES 115 may interface with the APC framework 120 through an associated equipment interface. Additionally, it should be noted that although various components, such as the equipment interface 110 of the system 100 of FIG. 1 are shown as stand-alone components, in alternative embodiments, such components may be integrated into the processing tool 105. Similarly, the FD unit 150 may be integrated into the APC framework 120. Additionally, the storage unit 170 of the FD unit 150 may be located at any suitable location in the manufacturing system 100 such that various components of the manufacturing system 100 can access the contents stored therein.

Figure 2:
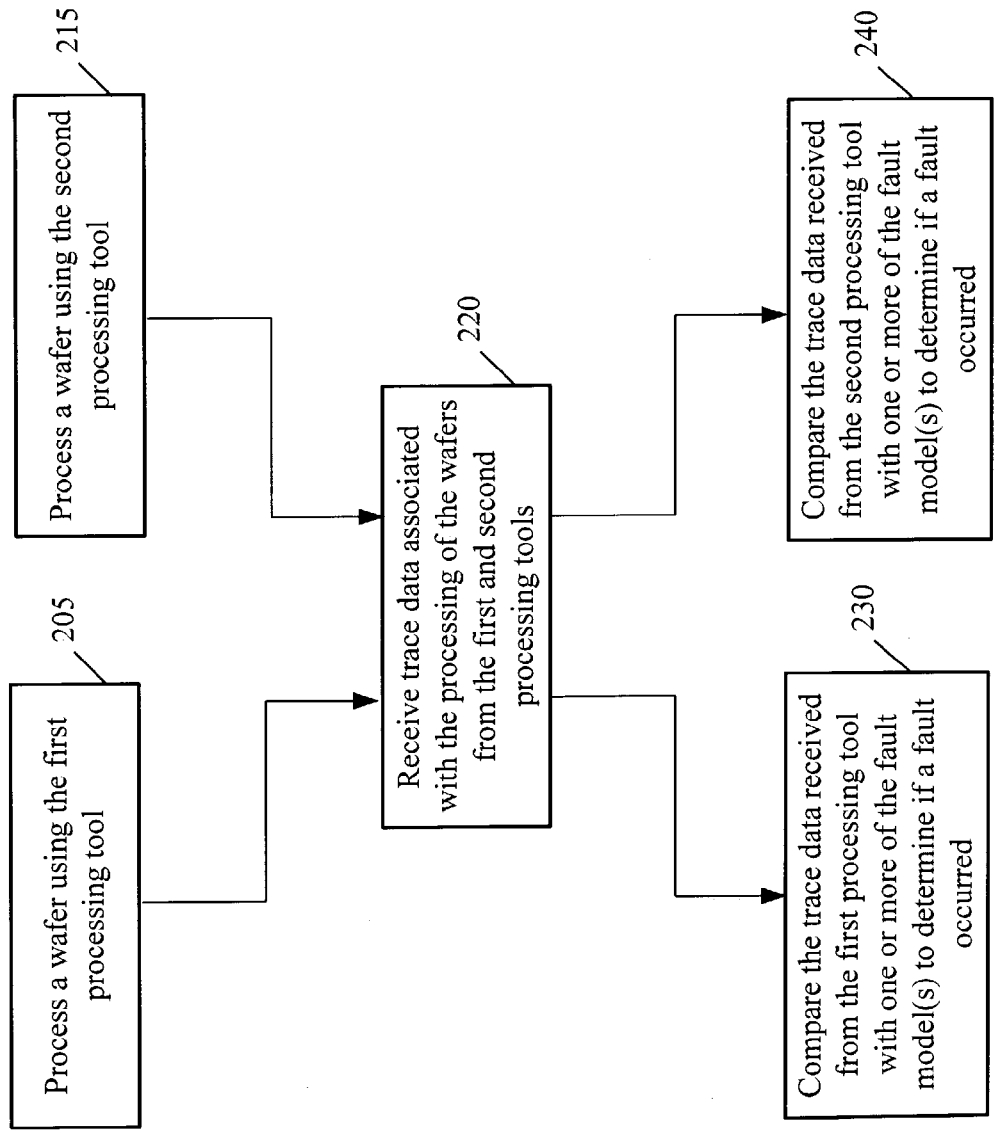
FIG. 2 illustrates a flow diagram of a method that may be implemented in the system of FIG. 1, in accordance with one embodiment of the present invention.

Referring now to FIG. 2, a flow diagram of a method that may be implemented in the manufacturing system 100 of FIG. 1 is illustrated, in accordance with one embodiment of the present invention. For illustrative purposes, the method of FIG. 2 is described in the context of the manufacturing system 100 including two processing tools 105A, 105B, although in other embodiments more than two processing tools may be employed. Furthermore, it is assumed that the two processing tools 105A, 105B are of the same type (i.e., both are etching tools, deposition tools, etc.). The two processing tools 105A, 105B do not necessarily have to be in geographical proximity to each other.

The first processing tool 105A processes (at 205) a wafer, and the second processing tool 105B processes (at 215) a wafer. The two processing tools 105A, 105B may process their respective wafers at the same time or at different times. In one embodiment, the processing tools 105A, 105B may process a batch of wafers. As the wafers are processed (at 205, 215), the processing tools 105A, 105B may provide trace data associated with the processing of their respective wafers to the fault detection unit 150. As noted previously, the trace data may be provided in substantially real-time.

The fault detection (FD) module 165, which receives (at 220) the trace data associated with the processing of the wafers, compares (at 230, 240) the trace data with one or more of the fault models 180A-N to determine whether a fault occurred. Specifically, the FD module 165 compares (at 230) the trace data associated with the processing of the wafer by the first processing tool 105A to one or more of the fault models 180A-N to determine if a fault associated with the first processing tool 105A occurred. The FD module 165 compares (at 240) the trace data associated with the processing of the wafer by the second processing tool 105B to one or more of the fault models 180A-N to determine if a fault associated with the second processing tool 105B occurred. In one embodiment, the FD module 165, depending on the implementation goals, may select one or more of the fault models 180A-N that are optimal for fault detection.

In one embodiment, the FD module 165 may use one or more of the fault models 180A-N substantially simultaneously to determine if any faults associated with the first and second processing tools 105A, 105B occurred. In this manner, the FD module 165 may perform fault detection for the first and second processing tools 105A, 105B in parallel or substantially simultaneously. In one embodiment, the trace data provided from the processing tools 105A, 105B may be utilized to update one or more of the fault models 180 A-N.

The particular fault model(s) 180A-N used for fault detection may depend on the particular implementation. For example, if each fault model 180A-N is representative of a different process recipe step that is performed by the processing tools 105, then the fault detection module 165 may utilize the appropriate fault model 180 for a given recipe step to determine if a fault occurred with that recipe step. In one embodiment, the fault detection 165 may apply different fault models 180 for different processing tools 105, depending on which process steps are performed by the processing tools 105 and which corresponding fault models 180 are available for detecting faults with those steps.

Although the method of FIG. 2 is described in the context of two processing tools 105A, 105B, it should be understood that the method of FIG. 2 can be extended to more than two processing tools. Once the fault models 180 are generated that are representative of the operation of more than two processing tools 105, the acts described in the method of FIG. 2 can be extended to detecting faults with the processing tools 105.

In accordance with one or more embodiments of the present invention, an efficient fault detection system is disclosed that can perform fault detection in parallel for a plurality of processing tools 105. In one embodiment, fault detection in parallel occurs through the fault model(s) 180 spanning across the multiple processing tools 105. That is, the fault model(s) 180 is common to a plurality of the processing tools 105. The common fault model(s) 180 may be used substantially simultaneously by the fault detection module 165 to detect faults with one or more of the processing tools 105. Utilizing common fault models 180 that are representative of the operation of multiple processing tools 105 saves time and hardware resources (e.g., storage space). Hardware resources may be saved because common, and hence fewer, fault models 180 can be utilized for fault detection in a manufacturing system 100 having a plurality of processing tools 105. Moreover, fewer fault models 180 means that a smaller time investment may be needed to keep the fault models updated. This savings in time and hardware resources can lower the overall manufacturing costs, and thus increase profitability.

The various system layers, routines, or modules may be executable by the control unit 155, 172 (see FIG. 1). As utilized herein, the term "control unit" may include one or more microprocessor, a microcontroller, a digital signal processor, a processor card (including one or more microprocessors or controllers), or other control or computing devices. The storage unit 170 (see FIG. 1) referred to in this discussion may include one or more machine-readable storage media for storing data and instructions. The storage media may include different forms of memory including semiconductor memory devices such as dynamic or static random access memories (DRAMs or SRAMS), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions when executed by a respective control unit cause the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
  receiving data associated with processing of a workpiece by a first processing tool;
  receiving data associated with processing of a workpiece by a second processing tool; and
  comparing at least a portion of the received data to a fault model common to both of the processing tools to determine if a fault associated with at least one of the processing of the workpiece by the first processing tool and processing of the workpiece by the second processing tool occurred.

2. The method of claim 1, wherein comparing the at least the portion of the received data comprises comparing the portion of the received data to a plurality of common fault models.

3. The method of claim 2, wherein comparing the portion of the received data to the plurality of common fault models comprises comparing the portion of the received data to the plurality of common fault models representing at least one of process recipe steps or tool states of the first and second processing tools.

4. The method of claim 1, further comprising receiving data associated with processing of a workpiece by a third processing tool and further comprising comparing the received data associated with the processing of the workpiece by the third process tool to the common fault model to determine if a fault occurred.

5. The method of claim 1, wherein receiving the data associated with the processing of the workpiece comprises receiving the data associated with the processing of a semiconductor wafer by the first processing tool.

6. The method of claim 1, wherein receiving the data comprises receiving metrology data associated with the processing of the wafer by the first processing tool and processing of the wafer by the second processing tool.

7. An apparatus, comprising:
  an interface adapted to receive trace data associated with processing of workpieces by the first and second processing tools; and
  a control unit communicatively coupled to the interface, the control unit adapted to detect a fault associated with at least one of the first and second processing tool based on comparing at least a portion of the received trace data to a fault model representative of an acceptable operational range of at least the first and second processing tools.

8. The apparatus of claim 7, wherein the workpiece is a semiconductor wafer.

9. The apparatus of claim 7, wherein the control unit is adapted to detect the fault based on comparing the portion of the received trace data to a plurality of fault models.

10. The apparatus of claim 9, wherein the plurality of fault models are representative of at least one of process recipe steps and tool states of the first and second processing tool.

11. The apparatus of claim 9, wherein the plurality of fault models have a hierarchical order.

12. The apparatus of claim 7, wherein the interface is further adapted to receive trace data associated with the processing of a workpiece by a third processing tool and wherein the control unit is adapted to detect a fault associated with at least one of the first processing tool, second processing tool, and third processing tool based on comparing at least a portion of the received trace data to the fault model.

13. The apparatus of claim 7, wherein the interface is a network interface and wherein the control unit is further adapted to update the fault model based on at least a portion of the trace data.

14. An apparatus, comprising:
    means for receiving data associated with processing of a workpiece by a first processing tool;
    means for receiving data associated with processing of a workpiece by a second processing tool; and
    means for comparing at least a portion of the received data to a common fault model to determine if a fault associated with at least one of the processing of the workpiece by the first processing tool and processing of the workpiece by the second processing tool occurred.

15. An article comprising one or more machine-readable storage media containing instructions that when executed enable a processor to:
    receive data associated with processing of a workpiece by a first processing tool and receive data associated with processing of a workpiece by a second processing tool; and
    compare at least a portion of the received data to a fault model to determine if a fault associated with the processing of the workpiece by the first processing tool occurred, wherein the fault model is representative of the first and the second processing tool.

16. The article of claim 15, wherein the instructions when executed enable the processor to compare at least a portion of the received data to the fault model to determine if a fault associated with the processing of the workpiece by the second processing tool occurred.

17. The article of claim 15, wherein the instructions when executed enable the processor to compare the portion of the received data to a plurality of fault models.

18. The article of claim 17, wherein the instructions when executed enable the processor to compare the portion of the received data to the plurality of fault models that are representative of at least one of processing recipe steps and tool states of the first and second processing tools.

19. The article of claim 15, wherein the instructions when executed enable the processor to receive trace data associated with the processing of a workpiece by a third processing tool and to detect a fault associated with the processing of the workpiece by the third processing tool using the fault model.

20. A system, comprising:
    a first processing tool adapted to process a wafer;
    a second processing tool adapted to process a wafer; and
    a fault detection unit adapted to:
        receive data associated with the processing of the wafer by the first processing tool and by the second processing tool; and
        detect a fault associated with at least one of the first and second processing tool based on comparing at least a portion of the received data to a fault model, wherein the fault model is representative of an acceptable operational range of at least the first and second processing tools.

21. The system of claim 20, wherein an advanced process control framework is coupled between the first and second processing tools and the fault detection unit.

* * * * *

UNITED STATES PATENT AND TRADEMARK OFFICE
CERTIFICATE OF CORRECTION

| | |
|---|---|
| PATENT NO. | : 8,359,494 B2 |
| APPLICATION NO. | : 10/323272 |
| DATED | : January 22, 2013 |
| INVENTOR(S) | : Elfido Cross, Jr. et al. |

It is certified that error appears in the above-identified patent and that said Letters Patent is hereby corrected as shown below:

Column 8, line 1, cancel the text beginning with "1. A method, comprising:" and ending "tool occurred." in column 8, line 35, and insert the following claim:

--1. A method, comprising:
receiving first data associated with processing of a workpiece by a first
processing tool;
receiving second data associated with processing of a workpiece by a
second processing tool wherein receiving the first and second
data comprises receiving the first and second data associated with
the processing of the wafer by the first and second processing
tools in real time;
comparing at least a portion of at least one of the first received data and
the second received data to a fault model common to both of the
processing tools to determine if a fault associated with at least
one of the processing of the workpiece by the first processing tool
and processing of the workpiece by the second processing tool
occurred; and
updating the fault model based on at least a portion of at least one of the
first received data and the received second data.--

Column 8, line 36, cancel the text beginning with "2. The method of claim 1," and ending "models." in column 8, line 39, and insert the following claim:

--2. The method of claim 1, wherein comparing comprises comparing
the portion of the at least one of the received first data and the received second
data to a plurality of common fault models.--

Column 8, line 40, cancel the text beginning with "3. The method of claim 2," and ending "models." in column 8, line 45, and insert the following claim:

Signed and Sealed this
Twenty-sixth Day of March, 2013

Teresa Stanek Rea
*Acting Director of the United States Patent and Trademark Office*

--3. The method of claim 2, wherein comparing comprises comparing the portion of the least one of the received first and second data to the plurality of common fault models representing at least one of process recipe steps and tool states of the first and second processing tools.--

Column 8, line 46, cancel the text beginning with "4. The method of claim 1," and ending "if a fault occurred." in column 8, line 51, and insert the following claim:

--4. A method, comprising:
receiving first data associated with processing of a workpiece by a first processing tool;
receiving second data associated with processing of a workpiece by a second processing tool;
receiving third data associated with processing of a workpiece by a third processing tool;
comparing at least a portion of at least one of the first received data and the second received data to a fault model common to both of the processing tools to determine if a fault associated with at least one of the processing of the workpiece by the first processing tool and processing of the workpiece by the second processing tool occurred; and
comparing the received third data associated with the processing of the workpiece by the third process tool to the common fault model to determine if a fault occurred.--

Column 8, line 52, cancel the text beginning with "5. The method of claim 1," and ending "first processing tool." in column 8, line 55, and insert the following claim:

--5. The method of claim 1, wherein receiving the first data associated with the processing of the workpiece comprises receiving the first data associated with the processing of a semiconductor wafer by the first processing tool.--

Column 8, line 56, cancel the text beginning with "6. The method of claim 1," and ending "second processing tool." in column 8, line 59, and insert the following claim:

--6. The method of claim 1, wherein receiving the first data comprises receiving metrology data associated with the processing of the wafer by the first processing tool.--

Column 8, line 60, cancel the text beginning with "7. An apparatus, comprising:" and ending "tools." in column 9, line 3, and insert the following claim:

--7. An apparatus, comprising:
an interface adapted to receive trace data associated with processing of
    workpieces by the first and second processing tools; and
a control unit communicatively coupled to the interface, the control unit adapted
    to detect a fault associated with at least one of the first and second
    processing tool based on comparing the received trace data associated
    with at least one of the first and second processing tools to a fault model
    representative of an acceptable operational range of at least the first and
    second processing tools, and adapted to update the fault model based on
    at least a portion of the trace data associated with at least one of the first
    processing tool and the second processing tool.--

Column 9, line 6, cancel the text beginning with "9. The apparatus of claim 7," and ending "fault models." in column 9, line 8, and insert the following claim:

--9. The apparatus of claim 7, wherein the control unit is adapted to
detect the fault based on comparing the received trace data associated with at
least one of the first and second processing tools to a plurality of fault models.--

Column 9, line 14, cancel the text beginning with "12. The apparatus of claim 7," and ending "fault model." in column 9, line 20, and insert the following claim:

--12. The apparatus of claim 7, wherein the interface is further adapted
to receive trace data associated with the processing of a workpiece by a third
processing tool and wherein the control unit is adapted to detect a fault
associated with the third processing tool based on comparing the received trace
data associated with the third processing tool to the fault model.--

Column 9, line 21, cancel the text beginning with "13. The apparatus of claim 7," and ending "trace data." in column 9, line 24, and insert the following claim:

--13. The apparatus of claim 7, wherein the interface is a network
interface.--

Column 9, line 25, cancel the text beginning with "14. An apparatus, comprising:" and ending "tool occurred." in column 9, line 34, and insert the following claim:

--14. An apparatus, comprising:
means for receiving data associated with processing of a workpiece by a first
    processing tool;
means for receiving data associated with processing of a workpiece by a second
    processing tool;

means for comparing the received data associated with at least one of the first processing tool and the second processing tool to a common fault model to determine if a fault associated with at least one of the processing of the workpiece by the first processing tool and processing of the workpiece by the second processing tool occurred; and means for updating the fault model based on at least a portion of the trace data associated with at least one of the first processing tool and the second processing tool.--

Column 9, line 35, cancel the text beginning with "15. An article comprising," and ending "second processing tool." in column 10, line 5, and insert the following claim:

--15. An article comprising one or more non-transitory, machine-readable storage media containing instructions that when executed enable a processor to:

receive data associated with processing of a workpiece by a first processing tool in real time and receive data associated with processing of a workpiece by a second processing tool in real time;

compare the received data associated with at least one of the first and second processing tool to a fault model to determine if a fault associated with the processing of the workpiece by the first processing tool occurred, wherein the fault model is representative of the first and the second processing tool; and update the fault model based on at least a portion of at least one of the received data associated with processing of the workpiece by said first processing tool and the received data associated with processing of the workpiece by said second processing tool.--

Column 10, line 6, cancel the text beginning with "16. The article of claim 15," and ending "tool occurred." in column 10, line 10, and insert the following claim:

--16. The article of claim 15, wherein the instructions when executed enable the processor to compare the received data associated with at least one of the first and second processing tools to the fault model to determine if a fault associated with the processing of the workpiece by the second processing tool occurred.--

Column 10, line 11, cancel the text beginning with "17. The article of claim 15," and ending "fault models." in column 10, line 13, and insert the following claim:

--17. The article of claim 15, wherein the instructions when executed enable the processor to compare the received data associated with at least one of the first and second processing tools to a plurality of fault models.--

CERTIFICATE OF CORRECTION (continued)

Column 10, line 14, cancel the text beginning with "18. The article of claim 17," and ending "second processing tools." in column 10, line 18, and insert the following claim:

--18. The article of claim 17, wherein the instructions when executed enable the processor to compare the received data associated with at least one of the first and second processing tools to the plurality of fault models that are representative of at least one of processing recipe steps and tool states of the first and second processing tools.--

Column 10, line 24, cancel the text beginning with "20. A system, comprising:" and ending "second processing tools." in column 10, lines 35-36, and insert the following claim:

--20. A system, comprising:
a first processing tool adapted to process a wafer;
a second processing tool adapted to process a wafer; and
a fault detection unit adapted to:
receive data associated with the processing of the wafer by the first processing tool and by the second processing tool in real time;
detect a fault associated with at least one of the first and second processing tool based on comparing the received data associated with at least one of the first and second processing tools to a fault model, wherein the fault model is representative of an acceptable operational range of at least the first and second processing tools; and
update the fault model based on at least a portion of at least one of the received data associated with processing of the workpiece by said first processing tool and the received data associated with processing of the workpiece by said second processing tool.--